United States Patent [19]

[11] 3,719,864

Taniguchi et al.

[45] March 6, 1973

[54] SEMICONDUCTOR DEVICE WITH TWO MOS TRANSISTORS OF NON-SYMMETRICAL TYPE

[75] Inventors: Kenji Taniguchi, Kodaira; Ichiro Imaizumi, Kokubunji, both of Japan

[73] Assignee: Hitachi, Ltd., Tokyo, Japan

[22] Filed: June 8, 1971

[21] Appl. No.: 151,054

[30] Foreign Application Priority Data

June 10, 1970 Japan ................................45/49444

[52] U.S. Cl.................317/235 R, 307/249, 307/304

[51] Int. Cl...........................H01l 11/14, H01l 19/00

[58] Field of Search.......317/235 B, 235 G; 307/205, 307/249, 251, 304; 330/35

[56] References Cited

UNITED STATES PATENTS

| | | | |
|---|---|---|---|
| 3,553,541 | 1/1971 | King | 317/235 |
| 3,603,811 | 9/1971 | Day et al. | 307/251 |

FOREIGN PATENTS OR APPLICATIONS

| | | | |
|---|---|---|---|
| 263,850 | 2/1964 | Australia | 307/249 |

*Primary Examiner*—Jerry D. Craig
*Attorney*—Craig, Antonelli & Hill

[57] ABSTRACT

A semiconductor device constituted by two MOS transistors of diffusion-self-alignment type, the source electrode and the gate electrode of one transistor being connected with the source electrode and the gate electrode of the other transistor, respectively. In the device, the mutually connected gate electrodes serve as a new gate electrode, while the drain electrode of said one transistor serves as a new drain electrode and the drain electrode of said other transistor serves as a new source electrode.

1 Claim, 4 Drawing Figures

INVENTORS

KENJI TANIGUCHI AND
ICHIRO IMAIZUMI

BY Craig, Antonelli & Hill
ATTORNEYS

SEMICONDUCTOR DEVICE WITH TWO MOS TRANSISTORS OF NON-SYMMETRICAL TYPE

BACKGROUND OF THE INVENTION

1. Field of the Invention

The present invention relates to a semiconductor device, and more particularly to a non-symmetrical type MOS transistor, in which the impurity concentrations in the source and drain regions are different from each other.

2. Description of the Prior Art

It has already been recognized in the theoretical design of a MOS transistor (hereinafter referred to as MOST for brevity) that the smaller is the length of the channel between source and drain regions the shorter becomes the switching time. However, the channel length of an MOST has been obtained at best in the range of 5 to 10 μ in the practical manufacture thereof due to a possible precision or accuracy attainable throughout the manufacturing process. Consequently, the thus resulted MOST has been limited in its useful extent and employed only for a variety of table computers and the like.

In order to avoid such a drawback, there has been proposed a diffusion-self-alignment type MOST (hereinafter referred to as DSA-MOST for brevity) in which the channel length of the MOST is rendered as small as about 1μ by means of such an impurity diffusion technique as is used to control the thickness of the base region as in a planar type transistor. The DSA-MOST is a kind of non-symmetrical type MOST's, in which the impurity concentrations in the source and the drain regions disposed along a direction transverse to the channel between the two regions, are different from each other. Therefore, if the direction of the electric current flowing between the source and the drain regions is changed, the operating characteristics of the MOST is also varied. Thus, its field of application will be disadvantageously limited.

SUMMARY OF THE INVENTION

The object of the present invention is to provide a non-symmetrical type MOST which never suffers from such a drawback as described above, that is, a non-symmetrical type MOST which can be operated as a transistor even if the direction of operating current is inverted.

The additional objects and advantages of this invention will become apparent from the following description beginning with a brief explanation of a conventional non-symmetrical MOST, when taken in conjunction with the accompanying drawings.

BRIEF DESCRIPTION OF THE PRIOR ART

DESCRIPTION OF THE PREFERRED EMBODIMENTS

Figure 1:
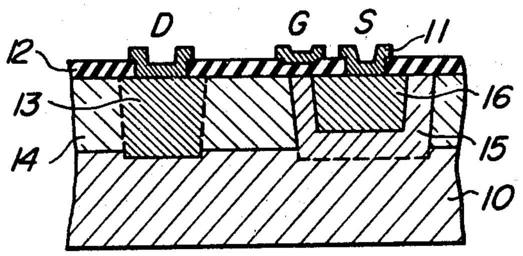
PRIOR ART FIG. 1
FIG. 1 illustrates a cross section of a conventional diffusion-self-alignment type MOS transistor (DSA-MOST).

In FIG. 1 is shown the structure of a DSA-MOST most commonly used in usual integrated circuits. The DSA-MOST comprises: a semiconductor substrate 10; an epitaxial layer 14 formed on the substrate by diffusion of such impurities as to render the layer 14 different in conductivity type from the substrate; an impurity-diffused region 15 formed in a portion of the epitaxial layer 14 by diffusion of such impurities as to render the region 15 the same in conductivity type as the substrate; and highly concentrated impurity diffused regions 13 and 16 formed respectively in another portion of the epitaxial layer 14 and the impurity diffused region 15, by diffusion of such impurities with high concentration as to render the conductivity type of the regions 13 and 16 the same as that of said epitaxial layer 14.

In the DSA-MOST having such a structure as described above, the impurity diffused region 15, in which the channel is to be formed, is by far smaller than that of the conventional MOST. And the channel length can be taken as small as 1 μ so that the time required for the operative transient will be extremely short. This will advantageously add to the swiftness of the operation. The conventional MOST has its source and drain regions formed and disposed in a symmetrical manner, but the DSA-MOST, as seen in FIG. 1, has its source and drain regions arranged in an asymmetrical manner. Therefore, if the direction of the current flowing between the source and the drain is changed, the characteristics of the DSA-MOST as a circuit element will be varied, too. This will give rise to a disadvantage that such DSA-MOST is restricted in its application. This fact will be apparent from the succeeding explanation.

In reference to FIG. 1, let it be assumed, for example, that the region 13 formed by diffusing impurities into the epitaxial layer 14 and the expitaxial layer 14 are a drain region D and that the region 16 formed in the impurity diffused region 15 of the same conductivity type as the substrate 10 is a source region S. Now, the impurity concentration of the source region S is higher than that of the region 15, while the impurity concentration of the region 15 is higher than that of the drain region (especially exclusive of the region 13). Hence, if a reverse bias voltage is impressed between the source region S and the region 15, the extension of depletion region, or a region where there are no charge carriers, is large in the region 15 but small in the region 16. Moreover, if a reverse bias voltage is applied between the region 15 and the drain region D, depletion the the extent of such depletion region is large in the drain region D but small in the region 15. Accordingly, the channel length is shortened when a reverse bias voltage is applied between the source region S and the region 15, while it undergoes no substantial change when the same bias voltage is impressed between the drain region D and the region 15. Now, let it be assumed, for example, that the semiconductor substrate 10 and the region 15 are of P-type and the source region S and the drain region D of N-type, and that the operation is performed under condition that the source region S and the substrate 10 are maintained at a zero potential while the drain region D is kept at a potential higher than zero. Then, the length of the channel formed in the region 15 is hardly changed, and the current flowing through the channel can be controlled by a signal applied to the gate electrode G provided on the region 15 with an insulation layer 12 (as seen in FIG. 1) interposed between the gate electrode G and the region 15. HOwever, if the potential of the source region S is higher than that of the substrate 10, the channel length gets smaller with the increase in the potential difference between the source region S and the substrate 10 until the region 15 becomes entirely occupied by a depletion region. In such a case that the region 15 is completely a depletion region, a rather heavy current flows between the source region and the drain region, depending upon the circuit constant of the external circuit but not upon the signal applied to the gate electrode G so that the normal operation as a transistor is no more possible.

Thus, the DSA-MOST, because of its asymmetrical structure, can not be used for a circuit in which the direction of the current flowing therethrough depends upon the operating condition thereof, that is, for example, for a memory circuit which performs information writing-in and reading-out operations.

The object of the present invention is to provide a non-symmetrical type MOST which is free from such a drawback as described above, that is, a non-symmetrical type MOST which can be operated as a transistor even if the direction of operating current is inverted.

The constitution for the attainment of the aforesaid object needs at least two non-symmetrical type MOST's combined in such a manner that the source electrode and the gate electrode of one non-symmetrical MOST are electrically coupled respectively to the source electrode and the gate electrode of the other non-symmetrical MOST, with the drain region of said one MOST provided with an input terminal and the drain region of said other MOST with an output terminal. The detailed description of the present invention will be given in the following.

Figure 2:
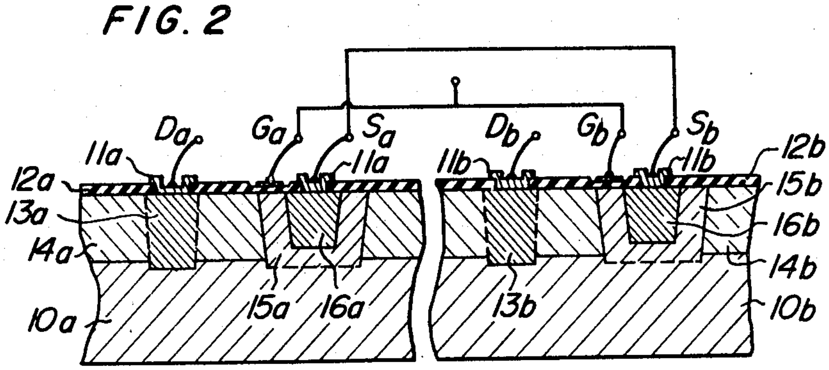
FIG. 2 is a cross section showing the structure of one embodiment of the DSA-MOST according to the present invention.

Reference should now be made to FIG. 2 which shows two DSA-MOST's of the same constitution. Since the constitutions of the two DSA-MOST's are identical with each other, only one of them is described as to the constituents thereof.

Semiconductor substrate is designated at 10*a*. An epitaxial layer 14*a* is formed in the substrate 10*a* by diffusion of such impurities as to render the conductivity of the resulted layer 14*a* different from that of the substrate. An impurity diffused region 15*a* is then formed in a portion of the epitaxial layer 14*a* by deep diffusion up to the substrate 10*a* of such impurities as to render the conductivity type of the resulted region 15a the same as that of the substrate 10*a*. An impurity diffused region 13*a* to serve as a drain D*a* is formed in another portion of the epitaxial layer 14*a* by diffusion of such impurities as to render the conductivity type of the resulted region 13*a* the same as that of the epitaxial layer 14*a*, while an impurity diffused region 16*a* to serve as a source S*a* is formed in the region 15*a* by diffusion of such impurities as to render the conductivity type of the resulted region 16*a* the same as that of the epitaxial layer 14*a*. A gate electrode G*a* is provided on the impurity diffused region 15*a* and aluminum electrodes 11*a* are provided respectively on the impurity diffused regions 13*a* and 16*a* to serve as terminals. Finally, a silicondioxide ($SiO_2$) layer is formed for insulation purposes. If we read the description of one DSA-MOST given above by replacing all the reference characters, i.e. 10*a*, 11*a*, 12*a*, 13*a*, 14*a*, 15*a*, 16*a*, D*a*, S*a*, G*a*, for new ones, i.e. 10*b*, 11*b*, 12*b*, 13*b*, 14*b*, 15*b*, 16*b*, D*b*, S*b*, G*b*, respectively, then we will have the description of the constitution for the other DSA-MOST. According to the present invention, it is essential that the source S*a* and the gate G*a* of one DSA-MOST are electrically connected respectively with the source S*b* and the gate G*b* of the other and that one of the drains D*a* and D*b* is used as an input terminal and the other as an output terminal.

The operation of the above described structure will next be explained. Let it be assumed for convenience' sake that the drain Da is used as an input terminal and the drain D*b* as an output one. A voltage is applied between the drains D*a* and D*b* through external circuits, but the sources S*a* and S*b* which are mutually connected and independent of the external circuits, are at a floating potential. The potentials at the substrates 10*a* and 10*b* are so chosen that the P-N junctions between the drain D*a* and the region 15*a* and between the drain D*b* and the region 15*b* are both reversely biased. The extension of depletion region into the region 15*a* and that into the region 15*b* due to the reverse biases are small. On the other hand, no extension of depletion region into the regions 15*a* and 15*b* takes place since any bias voltage is impressed neither between the source S*a* and the region 15*a* nor between the source S*b* and the region 15*b*. The same is true of the case where the roles of the drains D*a* and D*b* respectively as input and output terminals are interchanged with each other. Thus, it never happens with the DSA-MOST according to the present invention that both the regions 15*a* and 15*b* are entirely occupied by respective depletion regions, whereas it happens at times with the conventional DSA-MOST as shown in FIG. 1 of the drawings that a depletion region completely occupies the region 15, as has been already mentioned.

Now, if a control signal is applied to the gate electrode (consisting of two gates G*a* and G*b* connected mutually), electric current will flow from the drain D*a* as an input terminal to the drain Db as an output terminal in response to the control signal. This current in turn determines the potentials of the sources S*a* and S*b* so that reverse bias voltages appear between the source S*a* and the region 15*a* and between the source S*b* and the region 15*b*. The depletion regions which are given rise to by these reverse bias voltages cannot entirely occupy the regions 15*a* and 15*b*.

Figure 3:
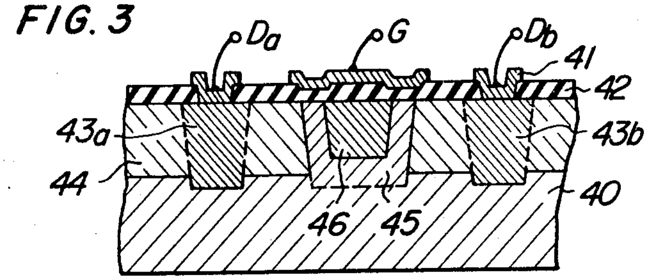
FIG. 3 shows in a cross section the structure of another embodiment of the DSA-MOST of the present invention.
Figure 4:
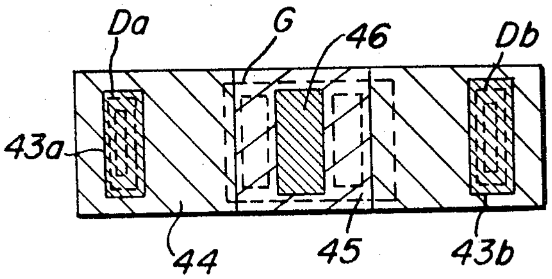
FIG. 4 shows a top view of the structure of the embodiment of the invention shown in FIG. 3, with respect to the regions of the substrate.

Reference should now be made to FIGS. 3 and 4 which show another embodiment of the present invention. The figures illustrate structure in which two DSA-MOST's are provided in a single substrate with their source regions formed integrally to serve as a common source. The structure may be called a composite DSA-MOST. The details of the composite DSA-MOST are as follows. In a semiconductor substrate 40 is formed an epitaxial layer 44 whose conductivity type is different from that of the substrate 40. An impurity diffused region 45 is formed in a portion of the epitaxial layer 44 to such a depth that the resulted region 45 may grow to reach the substrate proper 40, by deep diffusion of such impurities as to render the conductivity type of the region 45 the same as that of the substrate 40. Impurity diffused regions 43 *a* and 43*b* to serve respectively as drains D*a* and D*b* are formed in another portion of the epitaxial layer 44, which regions have the same conductivity type as the epitaxial layer 44. A highly concentrated impurity diffused region 46 to serve as a source, whose conductivity type is the same as that of the epitaxial layer 14, is formed in the impurity diffused region 45. A gate electrode G is provided for the region 45. Electrodes 41 are provided for the drain regions 43*a* and 43*b* through known metal evaporation technique. An oxide film 42 is provided for purpose of insulation. Any one of the drain electrodes 41 can be used as an input and accordingly the other as an output.

The composite DSA-MOST as described above will be equivalent in function to the structure as shown in FIG. 2 comprising two DSA-MOST's combined by electrical connection. Only structural differences are that in the structure of FIG. 2 the two DSA-MOST's are respectively produced in two separate substrates while the composite DSA-MOST is produced in a single substrate, and still that there are regions 16*a* and 16*b* connected through wire with each other in the FIG. 2 structure while there is an integrally formed region 46 in the FIG. 3 structure. The operation of the composite DSA-MOST of FIG. 3 will be readily understood by analogy with the FIG. 2 structure, and therefore omitted.

It is thus apparent that the DSA-MOST of the present invention can be satisfactorily operated with such a current as flows through the DSA-MOST now in a direction and now in the other direction, which is not the case with the conventional DSA-MOST. It should be noted that the present invention overcomes a difficulty that the conventional DSA-MOST's, in spite of their very swift operation, have not been used in memory circuits or logic circuits in which the direction of the current therethrough changes frequently. This is a distinguished advantage over the prior art DSA-MOST's.

We claim:

1. A semiconductor device comprising:

a semiconductor substrate having a first conductivity type;

an epitaxial layer having a second conductivity type opposite to that of said substrate, formed on said substrate;

a first diffused region, having said first conductivity type, formed in a portion of said epitaxial layer to such a depth that it reaches said semiconductor substrate;

second and third diffused regions, having said second conductivity type, and having an impurity concentration different from that of said epitaxial layer formed in said epitaxial layer and being spaced from each other by said first diffused region and respective portions of said epitaxial layer between said first diffused region and each of said second and third diffused regions;

a fourth diffused region having said second conductivity type, formed in a portion of said first diffused region and being separated from said epitaxial layer by a portion of said first diffused region in which said fourth diffused region is not diffused;

a first electrode electrically connected to said second diffused region;

a second electrode electrically connected to said third diffused region;

a third electrode disposed over the portion of said first diffused region between the portions of said epitaxial layer, adjacent one of said second and third regions and said fourth diffused region, and adjacent the other of said second and third regions and said fourth diffused region, with an insulation layer disposed between said third electrode and the respective portions of said first diffused region therebeneath; whereby in the presence of a potential between said first and second electrodes, an electrically conductive channel is prevented from being established between said second and third regions in the absence of a gating potential applied to said third electrode.

* * * * *